United States Patent
Matsukura et al.

(10) Patent No.: US 12,389,716 B2
(45) Date of Patent: Aug. 12, 2025

(54) NITRIDE SEMICONDUCTOR LIGHT-EMITTING ELEMENT

(71) Applicant: NIKKISO CO., LTD., Tokyo (JP)

(72) Inventors: Yusuke Matsukura, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 544 days.

(21) Appl. No.: 17/855,953

(22) Filed: Jul. 1, 2022

(65) Prior Publication Data

US 2023/0013312 A1 Jan. 19, 2023

(30) Foreign Application Priority Data

Jul. 6, 2021 (JP) ................. 2021-112014

(51) Int. Cl.
*H10H 20/812* (2025.01)
*H10H 20/81* (2025.01)
*H10H 20/825* (2025.01)

(52) U.S. Cl.
CPC ...... *H10H 20/812* (2025.01); *H10H 20/8215* (2025.01); *H10H 20/8252* (2025.01)

(58) Field of Classification Search
CPC ..... H01L 33/06; H01L 33/025; H01L 33/325; H01L 33/145; H01L 33/04; H01L 33/32;
(Continued)

(56) References Cited

U.S. PATENT DOCUMENTS

2018/0287014 A1* 10/2018 Asada ............... H01L 33/32
2021/0043802 A1 2/2021 Matsukura et al.

FOREIGN PATENT DOCUMENTS

CN 103647009 A 3/2014
CN 112349820 A 2/2021
(Continued)

OTHER PUBLICATIONS

Official Action dated Mar. 28, 2023 received from the Japanese Patent Office in related JP 2021-112014 together with English language translation.
(Continued)

*Primary Examiner* — Ajay Ojha
*Assistant Examiner* — Sandra Milena Rodriguez Villanu
(74) *Attorney, Agent, or Firm* — Scully, Scott, Murphy & Presser, PC

(57) ABSTRACT

A nitride semiconductor light-emitting element includes an active layer comprising at least one well layer, a p-type semiconductor layer located on one side of the active layer, and an electron blocking stack body located between the active layer and the p-type semiconductor layer. The electron blocking stack body includes a first electron blocking layer and a second electron blocking layer that is located on the p-type semiconductor layer side relative to the first electron blocking layer and has a lower Al composition ratio than that of the first electron blocking layer. When a total number of the well layers in the active layer is N, a film thickness of the first electron blocking layer is a film thickness d [nm] and an Al composition ratio of the second electron blocking layer is an Al composition ratio x [%], relationships $0.1N+0.9 \leq d \leq 0.2N+2.0$ and $10N+40 \leq x \leq 10N+60$ are satisfied.

6 Claims, 3 Drawing Sheets

(58) Field of Classification Search
CPC ....... H01L 33/12; H01L 27/15; H10H 20/812; H10H 20/8252; H10H 20/825; H10H 20/8162; H10H 20/811; H10H 20/815; H10K 50/11; H10K 50/181
See application file for complete search history.

(56) References Cited

FOREIGN PATENT DOCUMENTS

| | | | | |
|---|---|---|---|---|
| JP | 6698925 B1 | * | 5/2020 | ......... H01L 33/0025 |
| JP | 2021027194 A | | 2/2021 | |

OTHER PUBLICATIONS

Official Action dated Jul. 4, 2023 received from the Japanese Patent Office in related JP 2021-112014 together with English language translation.
Trial and Appeal Decision dated Oct. 8, 2024 from related JP 2021-112014, together with English language translation.
Official Action dated May 20, 2025 received from the China National Intellectual Property Administration in related application CN 202210792526.2 together with English language translation.

* cited by examiner

NITRIDE SEMICONDUCTOR LIGHT-EMITTING ELEMENT

CROSS-REFERENCE TO RELATED APPLICATION

The present patent application claims the priority of Japanese patent application No. 2021/112014 filed on Jul. 6, 2021, and the entire contents of Japanese patent application No. 2021/112014 are hereby incorporated by reference.

TECHNICAL FIELD

The present invention relates to a nitride semiconductor light-emitting element.

BACKGROUND ART

Patent Literature 1 discloses a nitride semiconductor light-emitting element which includes a first electron blocking layer arranged on an active layer and a second electron blocking arranged on the first electron blocking layer. The second electron blocking layer is configured to have a lower Al composition ratio than that of the first electron blocking layer.

CITATION LIST

Patent Literature

Patent Literature 1: JP 2021/027194 A

SUMMARY OF INVENTION

In case of the nitride semiconductor light-emitting element described in Patent Literature 1, there is room for improvement in terms of further improving light output.

The invention was made in view of such circumstances and it is an object of the invention to provide a nitride semiconductor light-emitting element capable of improving light output.

To achieve the object described above, the invention provides a nitride semiconductor light-emitting element, comprising:

an active layer comprising at least one well layer;

a p-type semiconductor layer located on one side of the active layer; and an electron blocking stack body located between the active layer and the p-type semiconductor layer, wherein the electron blocking stack body comprises a first electron blocking layer and a second electron blocking layer that is located on the p-type semiconductor layer side relative to the first electron blocking layer and has a lower Al composition ratio than that of the first electron blocking layer, and wherein, when a total number of the well layers in the active layer is N, a film thickness of the first electron blocking layer is a film thickness d [nm] and an Al composition ratio of the second electron blocking layer is an Al composition ratio x [%], the film thickness d of the first electron blocking layer satisfies a relationship $0.1N+0.9 \leq d \leq 0.2N+2.0$ and the Al composition ratio x of the second electron blocking layer satisfies a relationship $10N+40 \leq x \leq 10N+60$.

Advantageous Effects of Invention

According to the invention, it is possible to provide a nitride semiconductor light-emitting element capable of improving light output.

DESCRIPTION OF EMBODIMENTS

First Embodiment

The first embodiment of the invention will be described in reference to the FIG. 1. The embodiment below is described as a preferred illustrative example for implementing the invention. Although some part of the embodiment specifically illustrates various technically preferable matters, the technical scope of the invention is not limited to such specific aspects.

(Nitride Semiconductor Light-Emitting Element 1)

Figure 1:
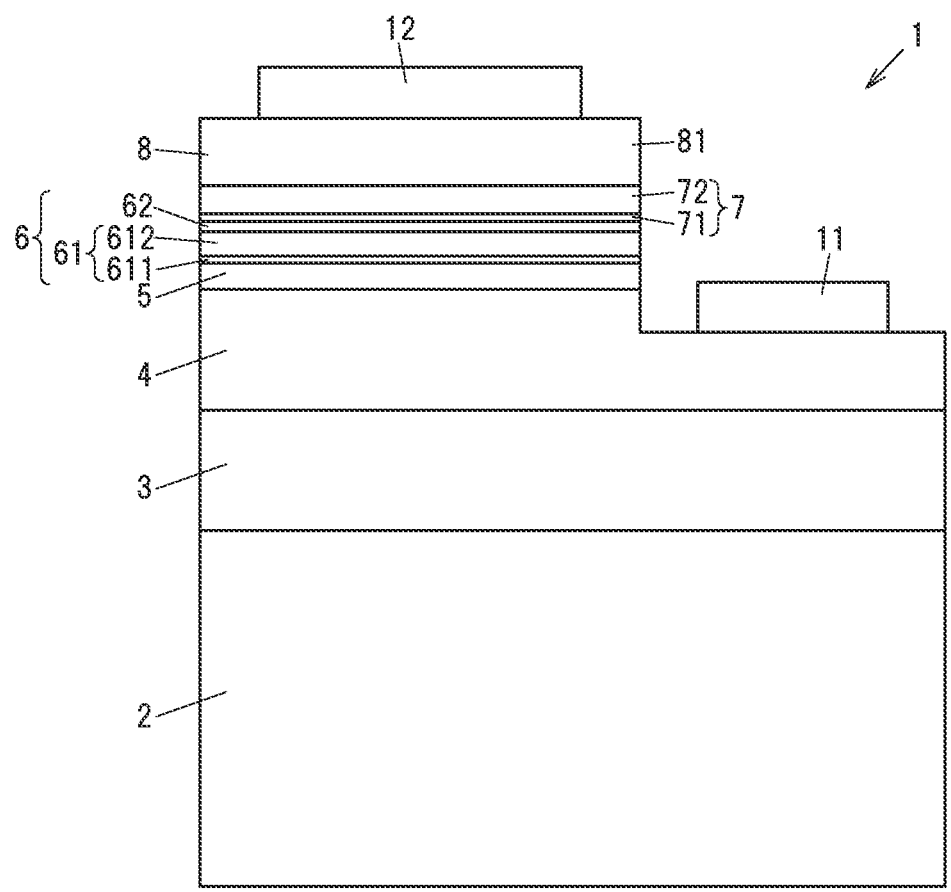
FIG. 1 is a schematic diagram illustrating a configuration of a nitride semiconductor light-emitting element in the first embodiment.

FIG. 1 is a schematic diagram illustrating a configuration of a nitride semiconductor light-emitting element 1 in the first embodiment. In FIG. 1, the scale ratio of each layer of the nitride semiconductor light-emitting element 1 (sometimes simply referred to as "the light-emitting element 1") 1 in a stacking direction is not necessarily the same as the actual scale ratio.

The light-emitting element 1 in the first embodiment is the light-emitting element 1 including a well layer 62 in a single quantum well structure. The light-emitting element 1 constitutes, e.g., a light-emitting diode (LED) or a semiconductor laser (LD: laser diode). In the first embodiment, the light-emitting element 1 constitutes a light-emitting diode (LED) that emits light with a wavelength in an ultraviolet region. Particularly, the light-emitting element 1 in the first embodiment constitutes a deep ultraviolet LED that emits deep ultraviolet light at a central wavelength of not less than 200 nm not more than 365 nm. The light-emitting element 1 in the first embodiment can be used in fields such as, e.g., sterilization (e.g., air purification, water purification, etc.), medical treatment (e.g., light therapy, measurement/analysis, etc.), UV curing, etc.

The light-emitting element 1 includes a buffer layer 3, an n-type cladding layer 4, a composition gradient layer 5, an active layer 6, an electron blocking stack body 7 and a p-type semiconductor layer 8 in this order on a substrate 2. Each layer on the substrate 2 can be formed by a well-known epitaxial growth method such as the Metal Organic Chemical Vapor Deposition (MOCVD) method, the Molecular Beam Epitaxy (MBE) method, or Hydride Vapor Phase Epitaxy (HVPE) method. The light-emitting element 1 also includes an n-side electrode 11 provided on the n-type cladding layer 4, and a p-side electrode 12 provided on the p-type semiconductor layer 8.

Hereinafter, a direction of stacking the substrate 2, the buffer layer 3, the n-type cladding layer 4, the composition gradient layer 5, the active layer 6, the electron blocking stack body 7 and the p-type semiconductor layer 8 (an up-and-down direction in FIG. 1) is referred to as the up-and-down direction. In addition, one side of the substrate 2 where each layer of the light-emitting element 1 is stacked (i.e., an upper side in FIG. 1) is referred to as the upper side, and the opposite side (i.e., a lower side in FIG. 1) is referred to as the lower side. The terms "upper" and "lower" are used for descriptive purposes and do not limit the posture of the light-emitting element 1 with respect to the vertical direction when, e.g., the light-emitting element 1 is in use. In the first embodiment, each layer constituting the light-emitting element 1 has a thickness in the up-and-down direction.

As semiconductors constituting the light-emitting element 1, it is possible to use, e.g., binary to quaternary group III nitride semiconductors expressed by $Al_aGa_bIn_{1-a-b}N$ ($0 \leq a \leq 1$, $0 \leq b \leq 1$, $0 \leq a+b \leq 1$). In deep ultraviolet LEDs, aluminum gallium nitride (AlGaN)-based semiconductors not including indium are often used. Here, "AlGaN" is a ternary mixed crystal in which a ratio of a composition of group III elements (i.e., a total composition of aluminum (Al) and gallium (Ga)) to a composition of nitrogen (N) is 1:1, and an aluminum composition ratio and a gallium composition ratio are arbitrary. These group III elements may be partially substituted with boron (B) or thallium (Tl), etc. In addition, nitrogen (N) may be partially substituted with phosphorus (P), arsenic (As), antimony (Sb) or bismuth (Bi), etc. Next, each constituent element of the light-emitting element 1 will be described.

(Substrate 2)

The substrate 2 is made of a material transparent to light (deep ultraviolet light in the first embodiment) emitted by the active layer 6. The substrate 2 is, e.g., a sapphire ($Al_2O_3$) substrate. Alternatively, e.g., an aluminum nitride (AlN) substrate or an aluminum gallium nitride substrate, etc., may be used as the substrate 2.

(Buffer Layer 3)

The buffer layer 3 is formed on the substrate 2. In the first embodiment, the buffer layer 3 is made of aluminum nitride. When the substrate 2 is an aluminum nitride substrate or an aluminum gallium nitride substrate, the buffer layer 3 may not be necessarily included.

(n-Type Cladding Layer 4)

The n-type cladding layer 4 is formed on the buffer layer 3. The n-type cladding layer 4 is made of, e.g., $Al_qGa_{1-q}N$ ($0 \leq q \leq 1$) doped with an n-type impurity. The subscript q in the composition $Al_qGa_{1-q}N$ indicates an Al composition ratio (also called AlN mole fraction). The Al composition ratio q of the n-type cladding layer 4 is, e.g., not less than 20%, and is preferably not less than 25% and not more than 70%. When the well layer 62 is formed to constitute a single quantum well structure as in the first embodiment, the Al composition ratio of the n-type cladding layer 4 is more preferably not less than 40% and not more than 60%.

The n-type cladding layer 4 has a film thickness of not less than 1 μm and not more than 4 μm. When the active layer 6 has a single quantum well (SQW) structure, the film thickness of the n-type cladding layer 4 is preferably about 3 μm. The lattice-relaxed n-type cladding layer 4 is preferable when the active layer 6 has a single quantum well structure, and it is easy to relax the lattice of the n-type cladding layer 4 when the film thickness of the n-type cladding layer 4 has not less than a certain value. Meanwhile, when the active layer 6 has a multiple quantum well (MQW) structure, the film thickness of the n-type cladding layer 4 is preferably about 2 μm. The coherently grown n-type cladding layer 4 is preferable when the active layer 6 has a multiple quantum well structure, and it is easy to promote coherent growth when the film thickness of the n-type cladding layer 4 has not more than a certain value. The n-type cladding layer 4 may have a single layer structure or may have a multilayer structure. In the first embodiment, silicon (Si) is used as an n-type impurity to dope the n-type cladding layer 4. The same applies to the semiconductor layers containing an n-type impurity other than the n-type cladding layer 4. Alternatively, germanium (Ge), selenium (Se) or tellurium (Te), etc., may be used as the n-type impurity.

(Composition Gradient Layer 5)

The composition gradient layer 5 is formed on the n-type cladding layer 4. The composition gradient layer 5 is made of $Al_rGa_{1-r}N$ ($0 < r \leq 1$). In the composition gradient layer 5, an Al composition ratio in the up-and-down direction is higher at an upper position. The composition gradient layer 5 may have a very small region in the up-and-down direction (e.g., a region of not more than 5% of the entire composition gradient layer 5 in the up-and-down direction) in which an Al composition ratio does not increase toward the upper side.

The composition gradient layer 5 is preferably configured such that the Al composition ratio at its lower end portion is substantially the same (e.g., a difference within 5%) as the Al composition ratio of the n-type cladding layer 4 and the Al composition ratio at its upper end portion is substantially the same (e.g., a difference within 5%) as the Al composition ratio of a first barrier layer 611. By providing the composition gradient layer 5, it is possible to prevent a sudden change in the Al composition ratio between the first barrier layer 611 and the n-type cladding layer 4 which are adjacent to the composition gradient layer 5 on the upper and lower sides. Occurrence of dislocations caused by lattice mismatch can thus be suppressed. As a result, the rate of non-luminescent recombination between electrons and holes in the active layer 6 decreases and light emitted from the active layer 6 increases. A film thickness of the composition gradient layer 5 can be set to, e.g., not less than 5 nm and not more than 20 nm. Silicon as an n-type impurity is contained in the composition gradient layer 5 in the first embodiment, but it is not limited thereto.

(Active Layer 6)

The active layer 6 is formed on the composition gradient layer 5. In the first embodiment, the active layer 6 is formed to have a single quantum well structure. The active layer 6 includes the first barrier layer 611, a second barrier layer 612 and the well layer 62 in this order from the n-type cladding layer 4 side. Hereinafter, the first barrier layer 611 and the second barrier layer 612, when not particularly distinguished, are simply referred to as "the barrier layers 61".

The first barrier layer 611 is made of $Al_{s1}Ga_{1-s1}N$ ($0 < s1 \leq 1$). In the first embodiment, an Al composition ratio s1 of the first barrier layer 611 is 100%. That is, the first barrier layer 611 in the first embodiment is made of AlN. The first barrier layer 611 serves to suppress injection of electrons with not more than a predetermined energy into the well layer 62. The first barrier layer 611 has a film thickness of, e.g., not less than 1.0 nm and not more than 5.0 nm.

The second barrier layer 612 is made of $Al_{s2}Ga_{1-s2}N$ ($0 < s2 \leq 1$). An Al composition ratio s2 of the second barrier layer 612 can be set to between an Al composition ratio t (described later) of the well layer 62 and the Al composition ratio s1 of the first barrier layer 611. The Al composition ratio s2 of the second barrier layer 612 can be, e.g., not less than 55% and not more than 75%. The second barrier layer 612 has a film thickness of, e.g., not less than 5 nm and not more than 20 nm.

The well layer 62 is made of $Al_tGa_{1-t}N$ (0≤t<1). The Al composition ratio t of the well layer 62 is lower than each of the Al composition ratios s1, s2 of the barrier layers 61. In the first embodiment, the Al composition ratio t of the well layer 62 is not less than 10% and not more than 30%. The well layer 62 preferably has a film thickness of, e.g., not less than 1 nm and not more than 10 nm, particularly preferably not less than 2 nm and not more than 4 nm.

In the first embodiment, silicon as an n-type impurity is contained in each of the first barrier layer 611, the second barrier layer 612 and the well layer 62. A silicon concentration in the active layer 6 along the up-and-down direction has the highest value in the first barrier layer 611 or the second barrier layer 612. This highest value is more than the silicon concentration in the composition gradient layer 5 at each position in the up-and-down direction. Alternatively, e.g., at least one of the first barrier layer 611, the second barrier layer 612 and the well layer 62 can be an undoped layer.

The active layer 6 generates light at a predetermined wavelength by recombination of electrons with holes in the single quantum well structure. In the first embodiment, the active layer 6 is configured to have a band gap of not less than 3.4 eV so that deep ultraviolet light at a wavelength of not more than 365 nm can be output. Particularly in the first embodiment, the active layer 6 is configured so that deep ultraviolet light at a central wavelength of not less than 200 nm and not more than 365 nm can be generated. Furthermore, when the active layer 6 has a single quantum well structure as in the first embodiment, the central wavelength of ultraviolet light emitted by the active layer 6 is preferably not less than 295 nm and not more than 365 nm from the viewpoint of improving light output.

(Electron Blocking Stack Body 7)

The electron blocking stack body 7 serves to improve efficiency of electron injection into the active layer 6 by suppressing occurrence of the overflow phenomenon in which electrons leak from the active layer 6 to the p-type semiconductor layer 8 (hereinafter, also referred to as the electron blocking effect). The electron blocking stack body has a stacked structure in which a first electron blocking layer 71 and a second electron blocking layer 72 are stacked in this order from the lower side. Hereinafter, the first electron blocking layer 71 and the second electron blocking layer 72, when not particularly distinguished, are simply referred to as "the electron blocking layers". The electron blocking layer is a layer which has an Al composition ratio of not less than 50% among the layers formed on the active layer 6.

The first electron blocking layer 71 is provided on the active layer 6 (on the well layer 62 in the first embodiment). The first electron blocking layer 71 is made of, e.g., $Al_uGa_{1-u}N$ (0<u≤1). An Al composition ratio u of the first electron blocking layer 71 is preferably, e.g., not less than 80% and not more than 100%, more preferably, not less than 90% and not more than 100%. The higher the Al composition ratio, the higher the electron blocking effect of suppressing passage of electrons. Thus, by forming the first electron blocking layer 71 with a high Al composition ratio at a position adjacent to the active layer 6, a high electron blocking effect is obtained at a position close to the active layer 6 and this makes it easy to ensure electron existence probability in the well layer 62.

A film thickness of the first electron blocking layer 71 is not less than 1.0 nm and not more than 2.2 nm. The film thickness of the first electron blocking layer 71 is preferably less than the film thickness of the well layer 62. When the first electron blocking layer 71 with a very high Al composition ratio u has an excessively large film thickness, it causes an excessive increase in the electrical resistance value of the entire light-emitting element 1 since a semiconductor layer with a higher Al composition ratio has a higher electrical resistance value. For this reason, the film thickness of the first electron blocking layer 71 is preferably small to some extent. On the other hand, if the film thickness of the first electron blocking layer 71 is reduced, it increases the probability that electrons pass through the first electron blocking layer 71 from the lower side to the upper side due to the tunnel effect. Therefore, in the light-emitting element 1 of the first embodiment, the second electron blocking layer 72 is formed on the first electron blocking layer 71 to suppress passage of electrons through the electron blocking stack body 7.

The second electron blocking layer 72 is made of, e.g., $Al_xGa_{1-x}N$ (0<x<1). An Al composition ratio x of the second electron blocking layer 72 is lower than the Al composition ratio u of the first electron blocking layer 71. In the first embodiment, the Al composition ratio x of the second electron blocking layer 72 is not less than 50% and not more than 70%. Although details will be described later, light output of the light-emitting element 1 is improved by setting the Al composition ratio x of the second electron blocking layer 72 to not less than 50% and not more than 70% and also setting the film thickness of the first electron blocking layer 71 to not less than 1.0 nm and not more than 2.2 nm as described above. A film thickness of the second electron blocking layer 72 can be set to, e.g., not less than 5 nm and not more than 100 nm, and is preferably not less than 10 nm and not more than 30 nm. The film thickness of the second electron blocking layer 72 is larger than each of the film thickness of the well layer 62 and the film thickness of the first electron blocking layer 71.

Each electron blocking layer can be an undoped layer, a layer containing an n-type impurity, a layer containing a p-type impurity, or a layer containing both an n-type impurity and a p-type impurity. Magnesium (Mg) can be used as the p-type impurity, but Zinc (Zn), beryllium (Be), calcium (Ca), strontium (Sr), barium (Ba) or carbon (C), etc., may be used other than magnesium. When each electron blocking layer contains an impurity, the impurity in each electron blocking layer may be contained in the entire portion of each electron blocking layer or may be contained in a part of each electron block layer.

(p-Type Semiconductor Layer 8)

The p-type semiconductor layer 8 is formed on the second electron blocking layer 72.

The p-type semiconductor layer 8 is a semiconductor layer with an Al composition ratio of less than 50%. In the first embodiment, the p-type semiconductor layer 8 is composed of a p-type contact layer 81. The p-type contact layer 81 is a layer connected to the p-side electrode 12 and is made of $Al_uGa_{1-u}N$ (0≤u≤1) doped with a high concentration of a p-type impurity. In the first embodiment, magnesium is used as the p-type impurity. Zinc, beryllium, calcium, strontium, barium or carbon, etc., may be also used as the p-type impurity. The p-type contact layer 81 is configured to have a low Al composition ratio to achieve an ohmic contact with the p-side electrode 12, and from such a viewpoint, the p-type contact layer 81 is preferably made of p-type gallium nitride (GaN).

(n-Side Electrode 11)

The n-side electrode 11 is formed on a surface of the n-type cladding layer 4 which is exposed on the upper side. The n-side electrode 11 can be made of, e.g., a multilayered film formed by sequentially stacking titanium (Ti), aluminum, titanium and gold (Au) on the n-type cladding layer 4.

(p-Side Electrode 12)

The p-side electrode 12 is formed on the p-type contact layer 81. The p-side electrode 12 is made of, e.g., a multi-layered film formed by sequentially stacking nickel (Ni) and gold on the p-type contact layer 81.

In the first embodiment, the light-emitting element 1 is flip-chip mounted on a package substrate (not shown). That is, the light-emitting element 1 is mounted such that a side in the up-and-down direction, which is a side where the n-side electrode 11 and the p-side electrode 12 are provided, faces the package substrate and each of the n-side electrode 11 and the p-side electrode 12 is attached to the package substrate via a gold bump, etc. Light from the flip-chip mounted light-emitting element 1 is extracted on the substrate 2 side (i.e., on the lower side). However, it is not limited thereto and the light-emitting element 1 may be mounted on the package substrate by wire bonding, etc. In addition, although the light-emitting element 1 in the first embodiment is a so-called lateral light-emitting element in which both the n-side electrode 11 and the p-side electrode 12 are provided on the upper side of the light-emitting element 1, the light-emitting element 1 is not limited thereto and may be a vertical light-emitting element. The vertical light-emitting element is a light-emitting element in which an active layer is sandwiched between an n-side electrode and a p-side electrode. In this regard, when the light-emitting element is of the vertical type, the substrate and the buffer layer are preferably removed by laser lift-off, etc.

(Film Thickness of First Electron Blocking Layer 71 and Al Composition Ratio of Second Electron Blocking Layer 72)

Each electron blocking layer, both when having a larger film thickness and when having a higher Al composition ratio, exerts a higher electron blocking effect and can increase electron existence probability in the well layer 62. However, there is a limit to the number of electrons which can be injected into one well layer 62. Therefore, simply increasing the film thickness and Al composition ratio of the electron blocking layer does not necessarily result in higher light output. As supported by Experimental Example 1 described later, appropriate values for the film thickness of the first electron blocking layer 71 and the Al composition ratio of the second electron blocking layer 72 differ depending on the total number of the well layers 62 in the active layer 6.

Here, a total number of the well layers 62 in the active layer 6 is N, the film thickness of the first electron blocking layer 71 is a film thickness d [nm], and the Al composition ratio of the second electron blocking layer 72 is the Al composition ratio x [%] as described above. The light-emitting element 1 can have a high light output when the film thickness d of the first electron blocking layer 71 satisfies a relationship $0.1N+0.9 \leq d \leq 0.2N+2.0$ and the Al composition ratio x of the second electron blocking layer 72 satisfies a relationship $10N+40 \leq x \leq 10N+60$. That is, the larger the total number N of the well layers 62 in the active layer 6, the higher the appropriate film thickness d of the first electron blocking layer 71 and the appropriate Al composition ratio x of the second electron blocking layer 72. The total number N of the well layers 62 in the active layer 6 is 1 in the first embodiment, hence, the film thickness d of the first electron blocking layer 71 satisfies the relationship $1.0 \leq d \leq 2.2$ and the Al composition ratio x of the second electron blocking layer 72 satisfies the relationship $50 \leq x \leq 70$. These numerical ranges are supported by Experimental Example described later.

The total number N of the well layers 62 in the active layer 6 is preferably not more than 5, more preferably not more than 4, from the viewpoint of improving light output of the light-emitting element 1. Particularly, the total number N of the well layers 62 is even more preferably 3 as in the second embodiment described later.

In addition, from the viewpoint of improving light output of the light-emitting element 1, it is preferable to adjust the Al composition ratio of the n-type cladding layer 4 according to the total number N of the well layers 62. In particular, the Al composition ratio of the n-type cladding layer 4 is preferably not less than $(5N+75)/2$ [%] and not more than $(5N+115)/2$ [%]. That is, the Al composition ratio of the n-type cladding layer 4 when, e.g., N=1 is preferably not less than 40% and not more than 60%, and the Al composition ratio of the n-type cladding layer 4 when, e.g., N=3 is preferably not less than 45% and not more than 65%. In case of the multiple quantum well structure in which the total number N of the well layers 62 is large, it is preferable to reduce the film thickness of the n-type cladding layer 4 and coherently grow the n-type cladding layer 4. On the other hand, when the total number N of the well layers 62 is small, it is preferable to increase the film thickness of the n-type cladding layer 4 and relax the lattice of the n-type cladding layer 4.

(Functions and Effect of the First Embodiment)

In the first embodiment, the film thickness d of the first electron blocking layer 71 satisfies the relationship $0.1N+0.9 \leq d \leq 0.2N+2.0$ and the Al composition ratio x of the second electron blocking layer 72 satisfies the relationship $10N+40 \leq x \leq 10N+60$. The total number N of the well layers 62 is 1 in the first embodiment, hence, the film thickness d of the first electron blocking layer 71 satisfies the relationship $1.0 \leq d \leq 2.2$ and the Al composition ratio x of the second electron blocking layer 72 satisfies the relationship $50 \leq x \leq 70$. The light-emitting element 1 thereby can have a high light output. The numerical values are supported by Experimental Example described later.

As described above, according to the first embodiment, it is possible to provide a nitride semiconductor light-emitting element capable of improving light output.

Second Embodiment

Figure 2:
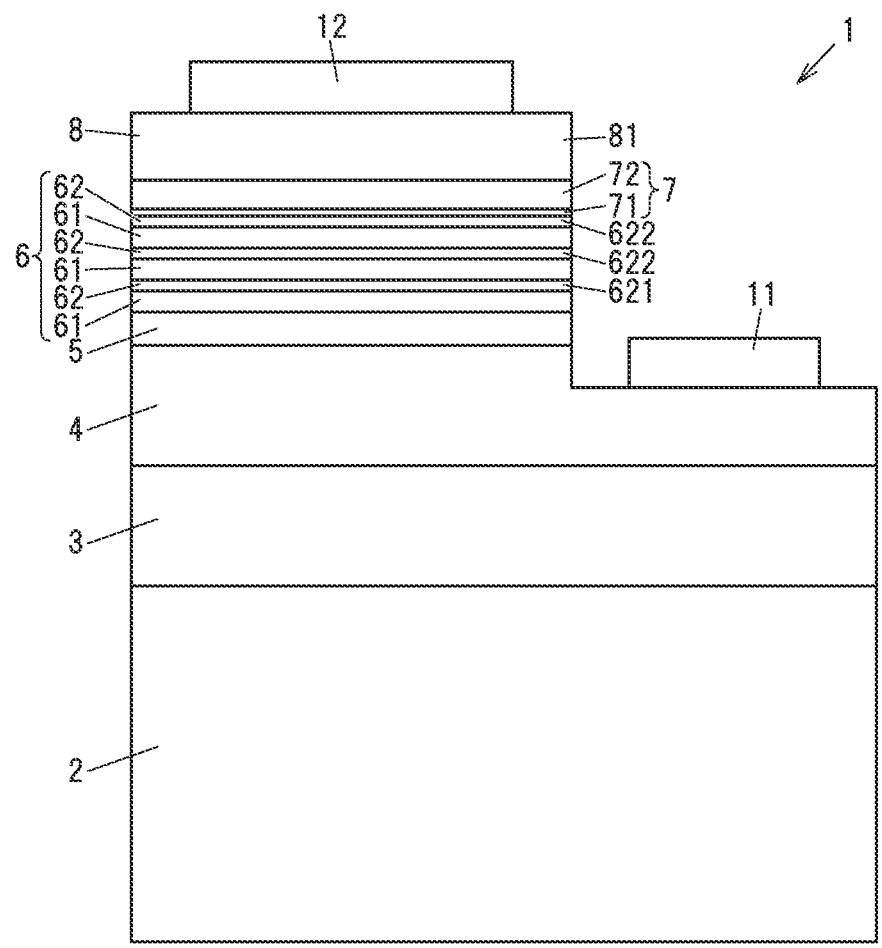
FIG. 2 is a schematic diagram illustrating a configuration of the nitride semiconductor light-emitting element in the second embodiment.

The light-emitting element 1 in the second embodiment includes the active layer 6 having a multiple quantum well structure. FIG. 2 is a schematic diagram illustrating a configuration of the light-emitting element 1 in the second embodiment.

The active layer 6 has three barrier layers 61 and three well layers 62 which are alternately stacked. In the active layer 6, the barrier layer 61 is located at the lower end and the well layer 62 is located at the upper end.

Each barrier layer 61 is made of $Al_vGa_{1-v}N$ ($0 < v \leq 1$). An Al composition ratio of each barrier layer 61 is preferably not less than 75% and not more than 95%. In addition, each barrier layer 61 has a film thickness of not less than 2 nm and not more than 12 nm.

The three well layers 62 are configured such that a lowermost well layer 621 (also referred to as a farthest well layer) formed at the farthest position from the p-type semiconductor layer 8 has a different configuration from upper-side well layers 622 which are two well layers 62 other than the lowermost well layer 621. That is, a film thickness of the lowermost well layer 621 is not less than 1 nm greater than a film thickness of each of the upper-side well layers 622 and an Al composition ratio of the lowermost well layer 621 is not less than 2% greater than an Al composition ratio of each of the two upper-side well layers 622. In the second embodiment, the upper-side well layers 622 have a film thickness of not less than 2 nm and not more than 4 nm and an Al composition ratio of not less than 25% and not more than 45%, and the lowermost well layer 621 has a film thickness of not less than 4 nm and not more than 6 nm and an Al composition ratio of not less than 35% and not more than 55%. A difference between the film thickness of the lowermost well layer 621 and the film thickness of each upper-side well layer 622 can be not less than 2 nm and not more than 4 nm. The film thickness of the lowermost well layer 621 can be not less than double and not more than three times the film thickness of the upper-side well layer 622. A difference between the Al composition ratio of the lowermost well layer 621 and the Al composition ratio of each upper-side well layer 622 can be not less than 10% and not more than 30%. The Al composition ratio of the lowermost well layer 621 can be not less than 1.4 times and not more than 2.2 times the Al composition ratio of the upper-side well layer 622.

Crystallinity of the lowermost well layer 621 is improved by increasing the Al composition ratio of the lowermost well layer 621 to higher than the Al composition ratio of the other well layers 62 (i.e., the upper-side well layers 622). This is because the difference in the Al composition ratio between the lowermost well layer 621 and the n-type cladding layer 4 is reduced. The improved crystallinity of the lowermost well layer 621 suppresses propagation of dislocations from the lowermost well layer 621 toward the upper side.

Furthermore, the improved crystallinity of the lowermost well layer 621 improves crystallinity of each layer formed on the lowermost well layer 621 in the active layer 6. As a result, carrier mobility in the active layer 6 is improved and intensity of output light is improved. Such effects are more pronounced when the lowermost well layer 621 has a larger film thickness, but the film thickness of the lowermost well layer 621 is designed to be not more than a predetermined value from the viewpoint of suppressing an increase in the electrical resistance value of the entire light-emitting element 1. Alternatively, the plural well layers 62 may be configured such that, e.g., the well layer 62 closer to the lower end has a higher the Al composition ratio.

In addition, e.g., the lowermost well layer 621 may be doped with silicon as an n-type impurity. This leads to formation of V-pits in the active layer 6, and such V-pits serve to stop advance of dislocations from the n-type cladding layer 4 side. In this regard, the upper-side well layers 622 may also contain an n-type impurity such as silicon.

When the active layer 6 has a multiple quantum well structure as in the second embodiment, the central wavelength of ultraviolet light emitted by the active layer 6 is preferably not less than 250 nm and not more than 295 nm from the viewpoint of improving light output.

The film thickness d of the first electron blocking layer 71 satisfies the relationship $0.1N+0.9 \leq d \leq 0.2N+2.0$ and the Al composition ratio x of the second electron blocking layer 72 satisfies the relationship $10N+40 \leq x \leq 10N+60$, in the same manner as the first embodiment. That is, the total number N of the well layers 62 is 3 in the second embodiment, hence, the film thickness d of the first electron blocking layer 71 is not less than 1.2 nm and not more than 2.6 nm and the Al composition ratio x of the second electron blocking layer 72 is not less than 70% and not more than 90%. With this configuration, it is possible to improve the light output of the light-emitting element 1. These numerical values are supported by Experimental Example described later.

In addition, by increasing the film thickness of the lowermost well layer 621 to larger than the film thickness of the upper-side well layers 622, the lowermost well layer 621 is flattened and flatness of each layer formed on the lowermost well layer 621 in the active layer 6 is also improved. As a result, it is possible to suppress variation in the Al composition ratio in each layer of the active layer and it is possible to improve monochromaticity of output light. Furthermore, flatness of each electron blocking layer formed on the active layer 6 is also improved. This allows each electron blocking layer to have an even film thickness. Therefore, fluctuation of the electron blocking effect depending on a position in a plane direction perpendicular to the up-and-down direction can be suppressed. As a result, the effect of improving light output by adjusting the film thickness d of the first electron blocking layer 71 and the Al composition ratio x of the second electron blocking layer 72 as described above is more easily obtained.

In addition, when the total number N of the well layers 62 is 3, the Al composition ratio of the n-type cladding layer 4 is preferably not less than 45% and not more than 65%.

The other configurations are the same as in the first embodiment.

Among the reference numerals used in the second embodiment onwards, the same reference numerals as those used in the already-described embodiment indicate the same constituent elements, etc., as those in the already-described embodiment, unless otherwise specified.

(Functions and Effect of the Second Embodiment)

Also in the second embodiment, the film thickness d of the first electron blocking layer 71 satisfies the relationship $0.1N+0.9 \leq d \leq 0.2N+2.0$ and the Al composition ratio x of the second electron blocking layer 72 satisfies the relationship $10N+40 \leq x \leq 10N+60$. The total number N of the well layers 62 is 3 in the second embodiment, hence, the film thickness d of the first electron blocking layer 71 satisfies the relationship $1.2 \leq d \leq 2.6$ and the Al composition ratio x of the second electron blocking layer 72 satisfies the relationship $70 \leq x \leq 90$. The light-emitting element 1 thereby can have a high light output. The numerical values are supported by Experimental Example described later.

In addition, the film thickness of the lowermost well layer 621 is not less than 1 nm greater than the film thickness of each upper-side well layer 622, and the Al composition ratio of the lowermost well layer 621 is not less than 2% greater than the Al composition ratio of each upper-side well layer 622. This improves crystallinity and flatness of each layer constituting the active layer 6, hence, light output and monochromaticity of the light-emitting element 1 can be improved.

Experimental Example 1

In this Experimental Example 1, light output was measured for Samples 1-4 which are single-quantum-well (SQW) light-emitting elements having the first electron blocking layers with various film thicknesses d, and Samples 5-12 which are multiple-quantum-well (MQW) light-emitting elements having the first electron blocking layers with various film thicknesses d. Samples 1-4 are light-emitting elements having the same basic structure as the first embodiment, and Samples 5-12 are light-emitting elements having the same basic structure as the second embodiment. Table 1 shows the detailed structure of each of Samples 1-4 which are single-quantum-well light-emitting elements, and Table 2 shows the detailed structure of each of Samples 5-12 which are multiple-quantum-well light-emitting elements. "3QW" in Table 2 means a multiple quantum well structure having three well layers.

TABLE 1

| Structure (Samples 1-4) | | Film thickness | Al composition ratio [%] |
|---|---|---|---|
| Substrate | | 430 ± 25 [μm] | — |
| Buffer layer | | 2000 ± 200 [nm] | 100 |
| n-type cladding layer | | 2000 ± 200 [nm] | 50 ± 10 |
| Composition gradient layer | | 10 ± 5 [nm] | 50 → 100 |
| Active layer (SQW) | First barrier layer | 1.5 ± 0.5 [nm] | 100 |
| | Second barrier layer | 10 ± 5 [nm] | 65 ± 10 |
| | Well layer | 3 ± 1 [nm] | 20 ± 10 |
| First electron blocking layer | | 1.0 – 2.3 [nm] | 95 ± 5 |
| Second electron blocking layer | | 20 ± 10 [nm] | 60 ± 10 |
| p-type contact layer | | 700 ± 100 [nm] | 0 |

TABLE 2

| Structure (Samples 5-12) | | Film thickness | Al composition ratio [%] |
|---|---|---|---|
| Substrate | | 430 ± 25 [μm] | — |
| Buffer layer | | 2000 ± 200 [nm] | 100 |
| n-type cladding layer | | 2000 ± 200 [nm] | 55 ± 10 |
| Composition gradient layer | | 15 ± 5 [nm] | 55 → 85 |
| Active layer (3QW) | Barrier layer | 7 ± 5 [nm] | 85 ± 10 |
| | Well layer (Lowermost well layer) | 5 ± 1 [nm] | 45 ± 10 |
| | Barrier layer | 7 ± 5 [nm] | 85 ± 10 |
| | Well layer (Upper-side well layer) | 3 ± 1 [nm] | 35 ± 10 |
| | Barrier layer | 7 ± 5 [nm] | 85 ± 10 |
| | Well layer (Upper-side well layer) | 3 ± 1 [nm] | 35 ± 10 |
| First electron blocking layer | | 0.7-3.0 [nm] | 95 ± 5 |
| Second electron blocking layer | | 20 ± 10 [nm] | 80 ± 10 |
| p-type contact layer | | 700 ± 100 [nm] | 0 |

The film thickness of each layer shown in Tables 1 and 2 was measured by a transmission electron microscope. The Al composition ratio of each layer shown in Tables 1 and 2 is a value estimated from secondary ion intensity of Al measured by Secondary Ion Mass Spectrometry (SIMS). The film thickness 1.0-2.3 [nm] for First electron blocking layer in Table 1 means that the first electron blocking layers of Samples 1-4 had various film thicknesses in the range of not less than 1.0 nm and not more than 2.3 nm. The film thickness 0.7-3.0 [nm] for First electron blocking layer in Table 2 means that the first electron blocking layers of Samples 5-12 had various film thicknesses in the range of not less than 0.7 nm and not more than 3.0 nm. In addition, the figures in the columns for Composition gradient layer show that the Al composition ratio of the composition gradient layer along the up-and-down direction changes from the lower end to the upper end, from 50% to 100% in Table 1 and from 55% to 85% in Table 2.

The Al composition ratios x of the second electron blocking layers of Samples 1-4 having a single quantum well structure have values of not less than 50% and not more than 70%. The Al composition ratios x of the second electron blocking layers of Samples 5-12 having a multiple quantum well structure (N=3) have values of not less than 70% and not more than 90%. That is, the Al composition ratios x of the second electron blocking layers satisfy the relationship $10N+40 \leq x \leq 10N+60$.

In this Experimental Example, light output of each of Samples 1-12 was measured. The light output of each sample is light output when supplying a current of 20 mW to each sample in the form of wafer. The light output was measured by a photodetector placed under each of Samples 1-12. Table 3 shows the total number N of the well layers, the film thickness d of the first electron blocking layer, the Al composition ratio x of the second electron blocking layer, emission wavelength and light output for Samples 1-12. The unit of the measured values of light output is arbitrary unit [a.u.].

TABLE 3

| | Total number N of Well layers | Film thickness d of First electron blocking layer [nm] | Al composition ratio of Second electron blocking layer [%] | Emission wavelength [nm] | Light output [a.u.] |
|---|---|---|---|---|---|
| Sample 1 | 1 | 1.0 | 60.5 | 321.5 | 0.90 |
| Sample 2 | 1 | 1.2 | 60.9 | 312.8 | 1.02 |
| Sample 3 | 1 | 1.7 | 63.2 | 318.8 | 1.19 |
| Sample 4 | 1 | 2.3 | 61.3 | 314.4 | 0.69 |
| Sample 5 | 3 | 0.7 | 70.5 | 283.4 | 0.33 |
| Sample 6 | 3 | 1.4 | 72.0 | 280.2 | 1.03 |
| Sample 7 | 3 | 1.5 | 74.6 | 278.6 | 1.03 |
| Sample 8 | 3 | 1.7 | 72.3 | 277.8 | 1.19 |
| Sample 9 | 3 | 2.1 | 73.1 | 278.6 | 1.16 |
| Sample 10 | 3 | 2.2 | 74.6 | 277.8 | 1.18 |
| Sample 11 | 3 | 2.4 | 74.0 | 282.6 | 1.22 |
| Sample 12 | 3 | 3.0 | 74.0 | 281.0 | 0.53 |

Figure 3:
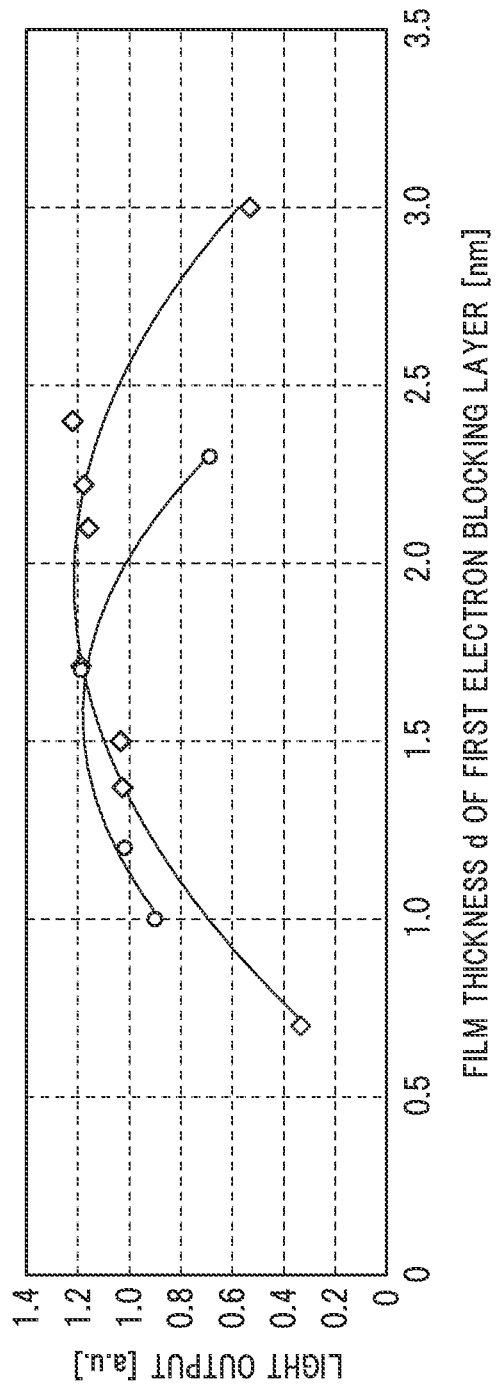
FIG. 3 is a graph showing a relationship between a film thickness d of a first electron blocking layer and light output for each sample in Example 1.

A relationship between the film thickness d of the first electron blocking layer and light output for each sample is shown in FIG. 3. In FIG. 3, the results for Samples 1-4 in which the total number N of the well layers is 1 are plotted with circles, and the results for Samples 5-12 in which the total number N of the well layers is 3 are plotted with diamonds. FIG. 3 also shows an approximate curve fitting the plotted circles and an approximate curve fitting the plotted diamonds.

As can be seen from Table 3 and FIG. 3, in case that the total number N of the well layers is 1 and on the condition that the Al composition ratio x of the second electron blocking layer satisfies not less than 50% and not more than 70%, light output of Samples 1-3, in which the film thickness d of the first electron blocking layer satisfies not less than 1.0 nm and not more than 2.2 nm, is high. On the other hand, in case that the total number N of the well layers is 1, light output of Sample 4, in which the film thickness d of the first electron blocking layer is out of the numerical range of not less than 1.0 nm and not more than 2.2 nm, is small. That is, when the total number N of the well layers is 1, it is preferable that the Al composition ratio x of the second electron blocking layer satisfy not less than 50% and not more than 70% and the film thickness d of the first electron blocking layer satisfy $1.0 \leq d \leq 2.2$. In addition, when the total number N of the well layers is 1, the film thickness d of the first electron blocking layer preferably satisfies $1.1 \leq d \leq 2.1$, more preferably $1.2 \leq d \leq 2.0$, further preferably $1.3 \leq d \leq 1.8$. In addition, when the total number N of the well layers is 1, the Al composition ratio x of the second electron blocking layer is preferably not less than 55% and not more than 65%, more preferably, not less than 60% and not more than 65%.

As can be also seen from Table 3 and FIG. 3, in case that the total number N of the well layers is 3 and on the condition that the Al composition ratio x of the second electron blocking layer satisfies not less than 70% and not more than 90%, light output of Samples 6-22, in which the film thickness d of the first electron blocking layer satisfies not less than 1.2 nm and not more than 2.6 nm, is high. On the other hand, in case that the total number N of the well layers is 3, light output of Samples 5 and 12, in which the film thickness d of the first electron blocking layer is out of the numerical range of not less than 1.2 nm and not more than 2.6 nm, is small. That is, when the total number N of the well layers is 3, it is preferable that the Al composition ratio x of the second electron blocking layer satisfy not less than 70% and not more than 90% and the film thickness d of the first electron blocking layer satisfy $1.2 \leq d \leq 2.6$. In addition, when the total number N of the well layers is 3, the film thickness d of the first electron blocking layer preferably satisfies $1.3 \leq d \leq 2.5$, more preferably $1.5 \leq d \leq 2.4$, further preferably $1.7 \leq d \leq 2.1$. In addition, when the total number N of the well layers is 3, the Al composition ratio x of the second electron blocking layer is preferably not less than 70% and not more than 80%, more preferably, not less than 70% and not more than 75%.

Experimental Example 2

This Experimental Example shows that light output is improved when the film thickness of the lowermost well layer (the farthest well layer) is not less than 1 nm greater than the film thickness of each upper-side well layer and the Al composition ratio of the lowermost well layer is not less than 2% greater than the Al composition ratio of each upper-side well layer as in the second embodiment.

In this Experimental Example, a light-emitting element having the same configuration as the second embodiment, in which the film thickness of the lowermost well layer is not less than 1 nm greater than the film thickness of each upper-side well layer and the Al composition ratio of the lowermost well layer is not less than 2% greater than the Al composition ratio of each upper-side well layer, was prepared as Example. In addition, a light-emitting element, in which all well layers have the same film thickness and the same Al composition ratio, was also prepared as Comparative Example. The light-emitting element in Example has the same basic structure as Samples 5-12 in Experimental Example 1 described above and the film thickness d of the first electron blocking layer is 1.9±0.2 nm. The light-emitting element in Comparative Example is the same as Example, except that all well layer have a film thickness of 3±1 nm and an Al composition ratio of 35±10% and the composition gradient layer, which is present in Example, is omitted. The film thickness and the Al composition ratio of each layer in Example are shown in Table 4, and the film thickness and the Al composition ratio of each layer in Comparative Example are shown in Table 5.

TABLE 4

| Structure (Example) | | Film thickness | Al composition ratio [%] |
|---|---|---|---|
| Substrate | | 430 ± 25 [µm] | — |
| Buffer layer | | 2000 ± 200 [nm] | 100 |
| n-type cladding layer | | 2000 ± 200 [nm] | 55 ± 10 |
| Composition gradient layer | | 15 ± 5 [nm] | 55 → 58 |
| Active layer (3QW) | Barrier layer | 7 ± 5 [nm] | 85 ± 10 |
| | Well layer | 5 ± 1 [nm] | 45 ± 10 |
| | Barrier layer | 7 ± 5 [nm] | 85 ± 10 |
| | Well layer | 3 ± 1 [nm] | 35 ± 10 |
| | Barrier layer | 7 ± 5 [nm] | 85 ± 10 |
| | Well layer | 3 ± 1 [nm] | 35 ± 10 |
| First electron blocking layer | | 1.9 ± 0.2 [nm] | 95 ± 5 |
| Second electron blocking layer | | 20 ± 10 [nm] | 80 ± 10 |
| p-type contact layer | | 700 ± 100 [nm] | 0 |

TABLE 5

| Structure (Comparative Example) | | Film thickness | Al composition ratio [%] |
|---|---|---|---|
| Substrate | | 430 ± 25 [µm] | — |
| Buffer layer | | 2000 ± 200 [nm] | 100 |
| n-type cladding layer | | 2000 ± 200 [nm] | 55 ± 10 |
| Active layer (3QW) | Barrier layer | 7 ± 5 [nm] | 85 ± 10 |
| | Well layer (Lowermost well layer) | 3 ± 1 [nm] | 35 ± 10 |
| | Barrier layer | 7 ± 5 [nm] | 85 ± 10 |
| | Well layer (Upper-side well layer) | 3 ± 1 [nm] | 35 ± 10 |
| | Barrier layer | 7 ± 5 [nm] | 85 ± 10 |
| | Well layer (Upper-side well layer) | 3 ± 1 [nm] | 35 ± 10 |
| First electron blocking layer | | 1.9 ± 0.2 [nm] | 95 ± 5 |
| Second electron blocking layer | | 20 ± 10 [nm] | 80 ± 10 |
| p-type contact layer | | 700 ± 100 [nm] | 0 |

Light output of each sample was measured in the same manner as Experimental Example 1. As a result, light output of the light-emitting element in Example was 1.29 [a.u.], and light output of the light-emitting element in Comparative Example was 0.56 [a.u.]. This shows that light output is improved by configuring such that the film thickness of the lowermost well layer is not less than 1 nm greater than the film thickness of each upper-side well layer and the Al composition ratio of the lowermost well layer is not less than 2% greater than the Al composition ratio of each upper-side well layer.

SUMMARY OF THE EMBODIMENTS

Technical ideas understood from the embodiments will be described below citing the reference signs, etc., used for the embodiments. However, each reference sign, etc., described below is not intended to limit the constituent elements in the claims to the members, etc., specifically described in the embodiments.

[1] The first aspect of the invention is a nitride semiconductor light-emitting element (1), comprising: an active layer (6) comprising at least one well layer (62); a p-type semiconductor layer (8) located on one side of the active layer (6); and an electron blocking stack body (7) located between the active layer (6) and the p-type semiconductor layer (8), wherein the electron blocking stack body (7) comprises a first electron blocking layer (71) and a second electron blocking layer (72) that is located on the p-type semiconductor layer (8) side relative to the first electron blocking layer (71) and has a lower Al composition ratio than that of the first electron blocking layer (71), and wherein, when a total number of the well layers (62) in the active layer (6) is N, a film thickness of the first electron blocking layer (71) is a film thickness d [nm] and an Al composition ratio of the second electron blocking layer (72) is an Al composition ratio x [%], the film thickness d of the first electron blocking layer (71) satisfies a relationship $0.1N+0.9 \leq d \leq 0.2N+2.0$ and the Al composition ratio x of the second electron blocking layer (72) satisfies a relationship $10N+40 \leq x \leq 10N+60$.

With this configuration, the nitride semiconductor light-emitting element can have a high light output.

[2] The second aspect of the invention is, in the first aspect, the active layer (6) comprises a plurality of the well layers (62), and when one of the plurality of well layers (62) which is formed at the farthest position from the p-type semiconductor layer (8) is defined as a farthest well layer (621), a film thickness of the farthest well layer (621) is not less than 1 nm greater than a film thickness of each of well layers (62) of the plurality of well layers (62) other than the farthest well layer (621), and the Al composition ratio of the farthest well layer (621) is not less than 2% greater than an Al composition ratio of each of well layers (62) the plurality of well layers (62) other than the farthest well layer (621). With this configuration, crystallinity and flatness of each layer constituting the active layer are improved, hence, light output and monochromaticity of the nitride semiconductor light-emitting element can be improved.

[3] The third aspect of the invention is that, in the first or second aspect, the total number N of the well layers (62) is 3, and the film thickness d of the first electron blocking layer (71) is not less than 1.7 nm and not more than 2.1 nm.

With this configuration, the nitride semiconductor light-emitting element can have a higher light output.

[4] The fourth aspect of the invention is that the Al composition ratio x of the second electron blocking layer (72) in the third aspect is not less than 65% and not more than 75%. With this configuration, the nitride semiconductor light-emitting element can have a higher light output.

[5] The fifth aspect of the invention is that, in the first or second aspect, the total number N of the well layers (62) is 1, and the film thickness d of the first electron blocking layer (71) is not less than 1.3 nm and not more than 1.8 nm.

With this configuration, the nitride semiconductor light-emitting element can have a higher light output.

[6] The sixth aspect of the invention is that the Al composition ratio x of the second electron blocking layer (72) in the fifth aspect is not less than 55% and not more than 65%. With this configuration, the nitride semiconductor light-emitting element can have a higher light output.

[7] The seventh aspect of the invention is that, in any one of first to sixth aspects, the Al composition ratio of the first electron blocking layer (71) is not less than 80%, and the film thickness of the second electron blocking layer (72) is not less than 10 nm and not more than 30 nm.

With this configuration, the nitride semiconductor light-emitting element can have a higher light output.

Additional Note

Although the embodiments of the invention have been described, the invention according to claims is not to be limited to the embodiments described above. Further, please note that not all combinations of the features described in the embodiments are necessary to solve the problem of the invention. In addition, the invention can be appropriately modified and implemented without departing from the gist thereof.

REFERENCE SIGNS LIST

1 NITRIDE SEMICONDUCTOR LIGHT-EMITTING ELEMENT
6 ACTIVE LAYER
62 WELL LAYER
621 LOWERMOST WELL LAYER (FARTHEST WELL LAYER)
7 ELECTRON BLOCKING STACK BODY
71 FIRST ELECTRON BLOCKING LAYER
72 SECOND ELECTRON BLOCKING LAYER
8 P-TYPE SEMICONDUCTOR LAYER

The invention claimed is:
1. A nitride semiconductor light-emitting element, comprising:
an active layer comprising a plurality of well layers;
a p-type semiconductor layer located on one side of the active layer; and
an electron blocking stack body located between the active layer and the p-type semiconductor layer,
wherein the electron blocking stack body comprises a first electron blocking layer and a second electron blocking layer that is located on the p-type semiconductor layer side relative to the first electron blocking layer and has a lower Al composition ratio than that of the first electron blocking layer,
wherein, when a total number of the well layers in the active layer is N, a film thickness of the first electron blocking layer is a film thickness d [nm] and an Al composition ratio of the second electron blocking layer is an Al composition ratio x [%], the film thickness d of the first electron blocking layer satisfies a relationship $0.1N+0.9 \leq d < 0.2N+2.0$ and the Al composition ratio x of the second electron blocking layer satisfies a relationship $10N+40 < x \leq 10N+60$; and
wherein when one well layer of the plurality of well layers which is formed at a farthest position from the p-type semiconductor layer is defined as a farthest well layer, a film thickness of the farthest well layer is not less than 1 nm greater than a film thickness of each layer of the plurality of well layers other than the farthest well layer, and the Al composition ratio of the farthest well layer is not less than 2% greater than an Al composition ratio of each layer of the plurality of well layers other than the farthest well layer.

2. The nitride semiconductor light-emitting element according to claim 1, wherein the total number N of well layers of the plurality of well layers is 3, and wherein the film thickness d of the first electron blocking layer is not less than 1.7 nm and not more than 2.1 nm.

3. The nitride semiconductor light-emitting element according to claim 2, wherein the Al composition ratio x of the second electron blocking layer is not less than 65% and not more than 75%.

4. The nitride semiconductor light-emitting element according to claim 1, wherein the total number N of well layers of the plurality of well layers is 1, and wherein the film thickness d of the first electron blocking layer is not less than 1.3 nm and not more than 1.8 nm.

5. The nitride semiconductor light-emitting element according to claim 4, wherein the Al composition ratio x of the second electron blocking layer is not less than 55% and not more than 65%.

6. The nitride semiconductor light-emitting element according to claim 1, wherein the Al composition ratio of the first electron blocking layer is not less than 80%, and wherein the film thickness of the second electron blocking layer is not less than 10 nm and not more than 30 nm.

\* \* \* \* \*